(12) United States Patent
Theis et al.

(10) Patent No.: US 7,773,001 B2
(45) Date of Patent: Aug. 10, 2010

(54) METHOD AND APPARATUS FOR CHANNEL CODING HAVING SMALL RUNNING DIGITAL SUM

(75) Inventors: Oliver Theis, Hannover (DE); Friedrich Timmermann, Garbsen (DE)

(73) Assignee: Thomson Licensing, Boulogne-Billancourt (FR)

( * ) Notice: Subject to any disclaimer, the term of this patent is extended or adjusted under 35 U.S.C. 154(b) by 0 days.

(21) Appl. No.: 12/150,680

(22) Filed: Apr. 30, 2008

(65) Prior Publication Data

US 2008/0278356 A1    Nov. 13, 2008

(30) Foreign Application Priority Data

May 7, 2007  (EP) .................................. 07107630

(51) Int. Cl.
*H03M 7/00* (2006.01)

(52) U.S. Cl. ............................. 341/59; 341/50

(58) Field of Classification Search ............. 341/50, 341/58, 59, 51, 106, 68, 69
See application file for complete search history.

(56) References Cited

U.S. PATENT DOCUMENTS

| | | | | |
|---|---|---|---|---|
| 6,839,004 B2 * | 1/2005 | Tsang | .................. | 341/59 |
| 6,950,042 B2 * | 9/2005 | Nakagawa et al. | ............ | 341/58 |
| 7,142,135 B1 | 11/2006 | Chen et al. | | |
| 7,378,994 B1 * | 5/2008 | Tseng et al. | .................. | 341/59 |
| 7,403,138 B2 * | 7/2008 | Coene | ......................... | 341/58 |
| 2007/0013564 A1 | 1/2007 | Noda et al. | | |

OTHER PUBLICATIONS

Coene W. et al. "EFMCC: A new combi-code for high density optical recording" Optical Data Storage, 2000. Conference Digest Whisler, BC, Canada May 14-17, 2000, Piscataway, NJ USA IEEE, US pp. 185-187 XP010501044.
Search Report dated Oct. 23, 2007.

\* cited by examiner

*Primary Examiner*—Peguy JeanPierre
(74) *Attorney, Agent, or Firm*—Robert D. Shedd; Harvey D. Fried; James McKenzie

(57) ABSTRACT

For controlling the DC-content of a Run Length Limited RLL modulated channel bit stream organized in data blocks, control bits are periodically inserted into control blocks which are dynamically placed and sized near the data block boundaries in such a way as to enable independent dk-encoding of the data blocks body and the control blocks. Running digital sum differences are calculated. Control bit insertion is done in such a way that the d,k constraints of the RLL code are not violated, that the encoded dk sequence of the data block body is not altered, and that the running digital sum is minimized by eventually inverting the contribution of the data block body thereto. Compared to the number of data bits per data block, few control bits are sufficient to keep the digital sum variation DSV of the Running Digital Sum RDS small.

9 Claims, 5 Drawing Sheets

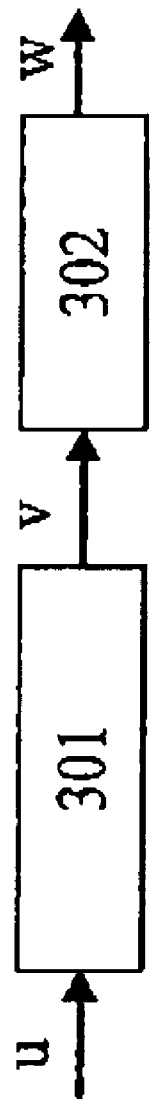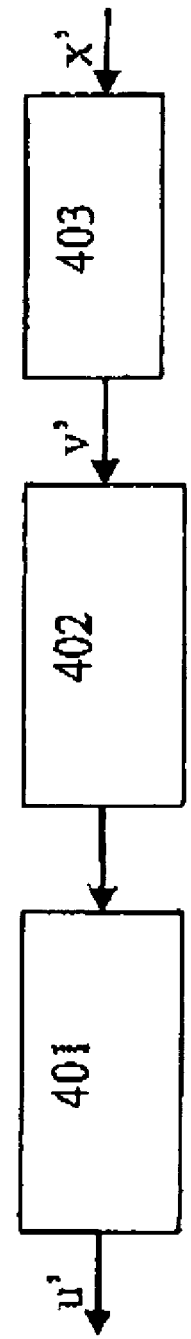
Fig 3
Fig 4

(501)

| Data | Code |
|------|------|
| 00 | 101 |
| 01 | 100 |
| 10 | 001 |
| 11 | 010 |

(502)

| Data | Code |
|------|------|
| 00.00 | 101.000 |
| 00.01 | 100.000 |
| 10.00 | 001.000 |
| 10.01 | 010.000 |

(503)

| | $u_{i-1}^{tail}$ | $c_i^{pre}$ | $c_i^{inv}$ | $u_i^{head}$ | Data | $dRDS^{ctrl}$ |
|---|---|---|---|---|---|---|
| 1 | | 00 | | | 101 | -1 |
| 2 | | | 11 | | 010 | -1 |
| 3 | | 00 | | 00 | 101.000 | +2 |
| 4 | | | 10 | 00 | 001.000 | -2 |
| 5 | | 11 | | 01 | 010 100 | +2 |
| 6 | | | 10 | 01 | 010.000 | -4 |
| 7 | 00 | 00 | | | 101.000 | +2 |
| 8 | 00 | | 01 | | 100.000 | -6 |
| 9 | 10 | 11 | | | 001 010 | +2 |
| 10 | 10 | | 00 | | 001.000 | -2 |

| Data | Code |
|------|------|
| 10   | 0100 |
| 11   | 1000 |
| 011  | 001000 |
| 010  | 100100 |
| 000  | 000100 |
| 0011 | 00100100 |
| 0010 | 00001000 |

(602)

| $u_{i-1}^{tail}$ | $c_i^{pre}$ | $c_i^{inv}$ | $u_j^{head}$ | Data | | $dRDS^{ctrl}$ |
|---|---|---|---|---|---|---|
|   | 010 |   |   | 100100 |   | 0 |
|   | 000 |   |   | 000100 |   | 0 |
|   | 101 |   | 0 | 01000100 |   | 0 |
|   | 001 |   | 0 | 00001000 |   | 0 |
| 0 | 011 |   |   | 00100100 |   | +2 |
| 0 | 010 |   |   | 00001000 |   | 0 |
| 00 | 111 |   | 1 | 00100100 | 1000 | +6 |
| 00 | 101 |   | 1 | 00001000 | 1000 | +4 |
| 00 | 111 |   | 0 | 00100100 | 0100 | 0 |
| 00 | 101 |   | 0 | 00001000 | 0100 | +3 |
| 001 | 010 |   |   | 00001000 | 0100 | +2 |
| 001 |    | 110 |   | 00100100 | 0100 | 0 |

Fig. 6

METHOD AND APPARATUS FOR CHANNEL CODING HAVING SMALL RUNNING DIGITAL SUM

This application claims the benefit, under 35 U.S.C. §119 of EP Patent Application 07107630.1 filed May 7, 2007.

FIELD OF THE INVENTION

The present invention relates to the technical field of channel coding sometimes also termed channel modulation, in particular to reducing the low frequency content of a channel coded runlength-limited signal.

BACKGROUND OF THE INVENTION

Storage as a transformation of signals in time can be modelled as a bandlimited channel, and for digital signal readout in particular, a bit clock is commonly regenerated from the read out signal. Both facts are reasons that Run-Length Limited or RLL channel codes are used on digital storage media. Also known as (d,k) codes, they convert any sequence of arbitrary payload bits into a longer sequence of channel bits that has at least d and at most k "0"s between consecutive "1"s. In a subsequent transcoding stage, historically also known as "preceding", the sequence containing the thus isolated "1"s is converted to an output signal where each of the "1"s in the sequence causes a state change in the output signal. In optical storage, such state changes are from "pit" to "space" or vice versa, and in magnetic recording, they are from a "plus" to a "minus" magnetic orientation, or vice versa. This transcoding is known as NRZI coding; for reasons of mathematical tractability, it is sometimes conceptually followed by a mapping of the amplitudes of the output signal to output values $w \in \{-1,+1\}$. Regardless of the physical basis of recording, the limitations on the distance of the "1"s in the sequence translate into the physically homogeneous regions between state changes on a storage track being of a length that is upper and lower limited.

FIG. 3 shows a block diagram of a prior art RLL-encoder having a dk-encoder 301 and a precoder 302. The dk-encoder 301 maps data tuples u consisting of a predefined number of unconstrained binary elements from {"0","1"} to constrained tuples v of binary elements. Because of the constraints that v must obey, the number of binary elements in v, i.e. the length of the dk-encoded bitstream, must be bigger than the number of elements in u, i.e. the length of the payload. In this, "unconstrained" means that any combination of element values may occur; correspondingly, "constrained" refers to certain combinations of values being forbidden, as described herein. The sequence of constrained tuples v is characterized by a minimum runlength constraint d and a maximum runlength constraint k. The d-constraint requires at least d "zeros" between consecutive "ones", the k-constraint requires at most k "zeros" between any two consecutive "ones". Using the NRZI approach, the constrained tuples v are precoded in a precoder 302 into precoded tuples w which will be stored.

For various reasons connected to signal regeneration on the storage readout side, it is important that the output signal w being written onto the medium is "DC free", with other words, that, at least on average, this signal contains as much of "pit" as of "space", or as much of "plus" as of "minus" in the magnetic case. As a criterion to measure this desirable property, the Running Digital Sum or RDS is used. In the domain of the symmetrically valued output values $w \in \{-1,+1\}$, the RDS corresponds to the time integral taken from some start time up to the current time. The RDS can as well be derived before the NRZI precoder, i.e. in the domain of the dk-encoded constrained tuples v. There it amounts to sequentially using the runs of "0"s between the isolated "1"s to alternatively count up and down in an up-down-counter. In addition to the RDS itself, its variation is also used as a criterion whether a code is DC-free. This variation is often designated as Digital Sum Variation or DSV and defined as DSV=max(RDS)−min(RDS)+1.

U.S. Pat. No. 5,151,699 describes a method for controlling the DC-content of a runlength-limited bitstream. Two different runlength-limited bitstreams, together called a "redundant data series", are generated in parallel by periodically inserting into the data bit stream DC control bits that are either "00" or "11". Because of the different control bits in the two parallel bitstreams, their respective Running Digital Sum (RDS) will also be different. The bitstream with the smaller RDS is chosen, the other one is discarded. A notion of "Digital Sum Value" or "DSV" is used in that disclosure to refer to what has been explained as RDS above. Although the method is generic and can be applied to a wide field of modulation codes, it is especially suited for RLL codes featuring the so-called "parity preserving" constraint, like the so-called "17 pp code". This constraint means that during the step of dk-encoding, the parity of the output tuple v must be equal to the parity of the input tuple u, for all pairs of u and v in the table describing the dk-encoder. It is easy to see that with parity preservation, inserting a control bit "1" into one of the bitstreams and inserting a control bit "0" into the other, will likely result in substantially different RDSs. However, in this method, because of the look ahead nature of the dk-encoder, the two parallel bitstreams are also very likely to have two different assignments (groupings) of data to codewords. This influences the RDS in each branch in an unsystematic and uncontrolled way, thus making DC-suppression less effective. The method of U.S. Pat. No. 5,151,699 can also be seen as having the disadvantage that of the two bitstream branches prepared, one will always be abandoned unused.

SUMMARY OF THE INVENTION

The invention aims at overcoming the above mentioned shortcomings of the prior art. Core of the invention is the concept to strongly connect a DC-control method with the underlying RLL code in a way that guarantees free choice of polarity for each data block through deliberate control bit insertion. This is accomplished by a strict separation of the bit stream into so-called control blocks and data block bodies which each can be and are independently dk-encoded, hence superseding the need for a second redundant RLL stream as in prior art DC control. For this, a few data bits around each data block boundary are grouped into the control blocks, which have slightly varying length and position. The specific length and position depend on the data to be channel coded. Into these control blocks, control bits are inserted at strictly periodic positions; in decoding, the control bits may simply be discarded.

Advantageously, in the invented method of DC control the dk-encoding of the data block is executed only once. Deliberate insertion of either polarity preserving or polarity inverting control bits enables that, if so desired, the contribution of every dk-encoded data block body to the overall RDS is individually flipped/inverted or not. This offers maximum freedom for either minimizing the RDS and DSV values when the code rate is given, or for decreasing the code redundancy when accepting a certain RDS performance.

Although the efficiency of the invented method depends on the underlying RLL code which dictates a certain minimum number of control bits, the underlying code is not required to have parity preserving or inverting properties. The invention achieves efficient DC-suppression without demanding parity preserving or inverting RLL codes. The invented method is applicable to a wide variety of RLL codes, of look ahead as well as variable length type. The bulk of the data blocks is dk-encoded only once, and by appropriate control bit insertion, its contribution to the overall DSV is simply inverted, because data to codeword assignment therein remains unchanged. Because of this sign switching, RDS control is systematic and very efficient.

RLL codes are suited to a varying extent to be used in conjunction with the invented DC-control algorithm. Examples are presented herein, which reveal that one known (1,7) RLL code needs two control bits, while another (2,7) RLL code example needs three. Hence, assuming identical allowable redundancy for DC-control, the DC-control blocks of the (2,7) RLL code have to be 50% longer than those of the (1,7) code. Longer blocks generally result in a bigger DSV, because the slope of the DSV can be influenced less often; and therefore in a less effective DC-suppression.

In a method of channel encoding binary data according to the invention, where the data consist of a sequence of incoming data blocks, the data blocks are separated into head parts, body parts, and tail parts of variable length in a way which enables independent dk-encoding of the body parts. With other words, head parts of variable length are being separated from the incoming data blocks in a way which enables that dk-encoding the head parts does not depend on a subsequent remainder of the respective data block; and the remainder of each of the data blocks is being separated into a body part and a tail part of variable length in a way which enables that dk-encoding the body parts does not depend on the subsequent tail parts. Then, the tail part of a previous data block, if any, is combined with an inverting control bit pattern and with the head part of the current data block, if any, into a polarity inverting control block; and the tail part of the previous data block, if any, is combined with a preserving control bit pattern and with the head part of the current data block, if any, into a polarity preserving control block. The polarity inverting control block and the polarity preserving control block are each dk-encoded, Running Digital Sum differences thereof are evaluated, and Running Digital Sums for the parity inverting case and for the parity preserving case are derived therefrom. One of the dk-encoded polarity inverting control block and the dk-encoded polarity preserving control block is selected, depending on which of the Running Digital Sums has smaller magnitude. The selected control block is time multiplexed together with the dk-encoded body part, and the result is NRZI modulated into the channel encoded binary data. In this, the length of the head parts and of the tail parts is zero or more bits, individually, as described below.

Advantageously, separating the incoming data blocks into head parts, body parts, and tail parts encompasses locating the start of the body part of a data block as the first position within the data block where the bit grouping used in assigning code bits to data bits is independent of the grouping used for the assigning within the control block preceding the body part, and locating the start of the tail part of a data block as being the first position within the data block where a reference to bits after the data block is needed for assigning code bits to the data bits. It constitutes a low complexity approach to ensure that the separation allows for independent dk-encoding of the body parts on one hand and the control blocks on the other hand.

Advantageously, deriving a Running Digital Sum for the parity preserving case encompasses adding to a previous value of the Running Digital Sum the Running Digital Sum difference of the polarity preserving control block and a Running Digital Sum difference of the dk-encoded body part; and deriving a Running Digital Sum for the parity inverting case encompasses adding to a previous value of the Running Digital Sum the Running Digital Sum difference of the polarity inverting control block and the negative Running Digital Sum difference of the dk-encoded body part. This advantageously exploits the fact that, due to the mutual dk-encoding independence between the body parts and the control blocks that is achieved by proper selection of head and tail part size and position, body parts, which typically contain most of data block bits need only be dk-encoded once, and their contribution to the RDS is simply inverted in the parity inverting case.

Advantageously, dk-encoding the control blocks and evaluating the Running Digital Sums of the dk-encoded control blocks is performed with a table lookup operation. This exploits the fact that conceptually the control blocks are short, so that the total number of possible control block values is accordingly limited and thus is apt for table storage.

Advantageously, the table lookup encompasses using the tail part of the previous data block and the beginning of the current data block as a table entry index, and retrieving, from the table cell thus accessed, at least one of the value to be used as the inverting control bit pattern, the value to be used as the preserving control bit pattern, code bits constituting the dk-encoded control block, and the RDS contribution of the dk-encoded control block. This advantageously exploits the fact, that all these data can be pre-computed for the set of possible control block values, so that repetitive derivations and calculations are avoided.

Correspondingly, an apparatus according to the invention for channel encoding binary data consisting of a sequence of incoming data blocks has a Control Block Builder equipped and configured to separate the incoming data blocks into head parts, body parts, and tail parts of variable length in a way which enables independent dk-encoding, to combine the tail part of a previous data block with an inverting control bit pattern and with the head part of the current data block into a polarity inverting control block, and to combine the tail part of the previous data block with a preserving control bit pattern and with the head part of the current data block into a polarity preserving control block. The apparatus also has a dk-encoder equipped and configured to dk-encode the polarity inverting control block, the polarity preserving control block and the body part; a Running Digital Sum calculator equipped and configured to calculate Running Digital Sum differences of the dk-encoded polarity inverting control block, of the dk-encoded polarity preserving control block and of the dk-encoded body part, and to derive therefrom Running Digital Sums for the parity inverting case and for the parity preserving case; a selector to select one of the dk-encoded polarity inverting control block and the dk-encoded polarity preserving control block depending on which of the Running Digital Sums has smaller magnitude, and to time-multiplex the selected control block together with the dk-encoded body part; and a modulator to NRZI modulate the time-multiplexed data into the channel encoded binary data.

Advantageously, the apparatus additionally comprises a table lookup unit accessible from at least one of the Control Block Builder, the dk-encoder, and the Running Digital Sum calculator, and the table contains at least one kind of entries of values to be used as the respective inverting control bit pattern, values to be used as the respective preserving control bit pattern, code bits constituting the respective dk-encoded control block, and RDS contributions of the respective dk-encoded control block.

It is advantageous to choose the head parts and the tail parts of the data blocks as short as possible. This directly minimizes the control block length and thus the percentage of data for which dk-encoding must be performed twice. In case of the table lookup embodiment, it minimizes table storage needs.

BRIEF DESCRIPTION OF DRAWINGS

Exemplary embodiments of the invention are illustrated in the drawings and are explained in more detail in the following description.

In the Figures:

FIG. 3 shows a block diagram of the known approach for RLL encoding;

FIG. 4 shows a block diagram of a prior art RLL-decoder;

FIG. 5 shows encoding tables of a prior art (1,7) RLL code, and a control bit insertion Table embodying the invention for that code.

FIG. 6 shows an encoding table of a prior art (2,7) RLL code, and a control bit insertion Table embodying the invention for that code.

DETAILED DESCRIPTION OF EXEMPLARY EMBODIMENTS

Figure 1:
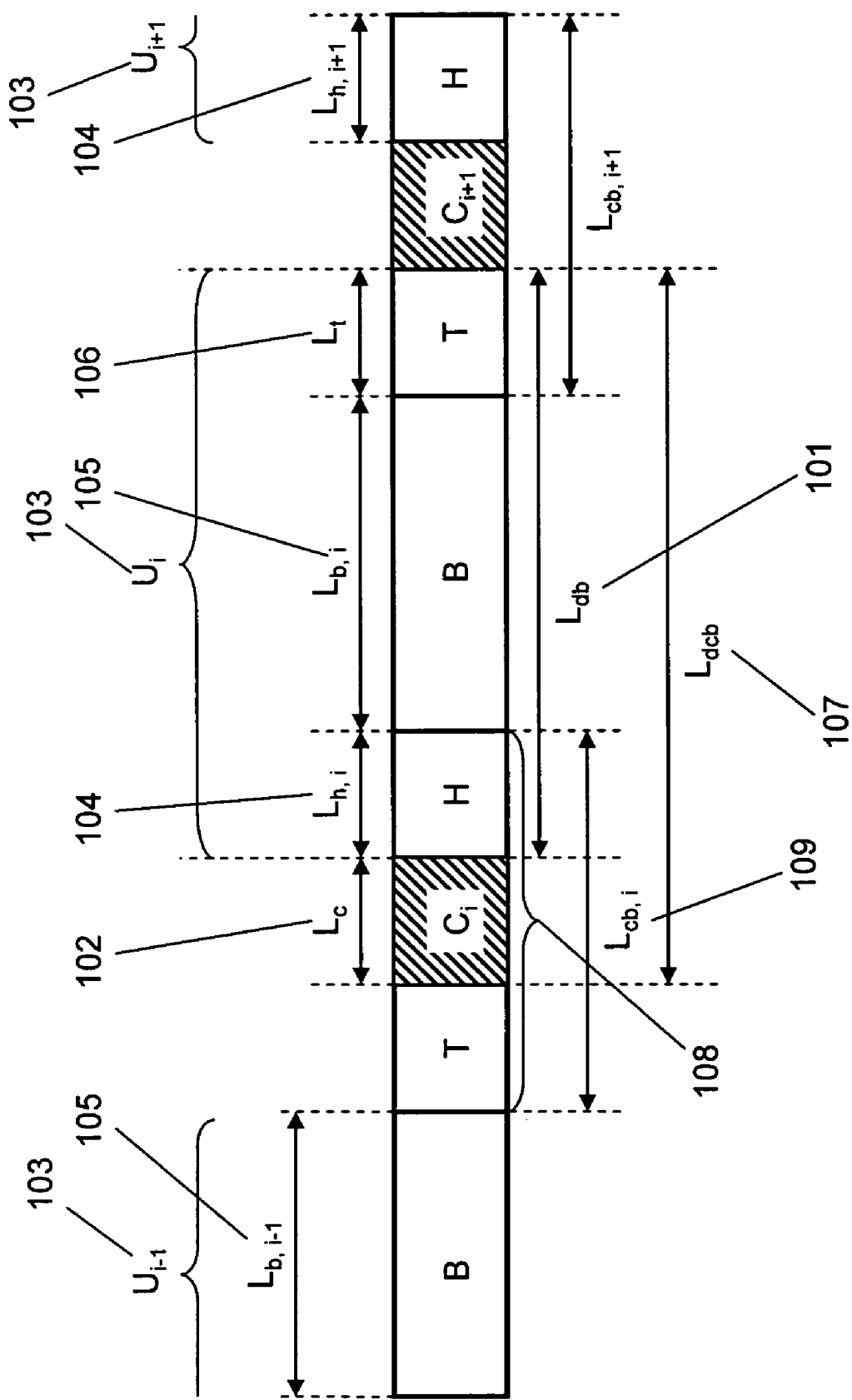
FIG. 1 shows the data partitioning used in the invention.

FIG. 1 shows the data partitioning used in the invention. An excerpt of a bitstream as it is used at the input of the dk-encoder according to the invention is symbolically shown. The bitstream comprises payload data blocks $u_{i-1}, u_i, u_{i+1}$ of a constant length $L_{db}$, separated by intervening control bits $c_i, c_{i+1}$ of constant length $L_c$. Each of the data blocks $u_i$ is conceptually subdivided into a head part H of individual length $L_{h,i}$, followed by a body part B of individual length $L_{b,i}$, followed by a tail part T of individual length $L_{t,i}$, with the only restriction that $L_{h,i}+L_{b,i}+L_{t,i}=L_{db}$=const. In front of each data block $u_i$, a string of control bits $c_i$ of length $L_c$ are inserted; the control bits $c_i$ together with the associated subsequent data block $u_i$ is denoted as a DC-control block of length $L_{dcb}=L_{db}+L_c$. This periodic insertion of control bits $c_i$ introduces a redundancy of $r=L_c/L_{dcb}$. The tail part of a previous data block, $u_{tail,i-1}$, the inserted control bits $c_i$, and the head part of a current data block are together considered as a control block 108 of variable length $L_{cb,i}=L_{t,i-1}+L_{c,i}+L_{h,i}$. By appropriately selecting the control bits $c_i$, the result of dk-encoding the control block 108 can be made to have either even or odd parity. Note that any of the head parts H or the tail parts T can eventually have zero length, with other words can be an empty bit string, depending on the surrounding bit patterns, as will be understood from the description below.

The tail part T of any data block $u_i$ is meant to encompass all those last data bits of the data block $u_i$ that can not uniquely be dk-encoded without knowledge of subsequent bits outside the data block, namely control bits. More than that, depending on the underlying dk code, sometimes even the head part H of the subsequent data block $u_{i+1}$ situated in sequence after the control bits, may be needed to dk-encode the last bits preceding the control bits. The length of the tail part of each data block, $u_{tail,i}$, is chosen according to this rule. Stepping forward to the next data block, that tail part becomes the tail part of the preceding block, $u_{tail,i-1}$ which must be known in order to be able to determine the length $L_{h,i}$ of the head part of the following data block, which is now the current data block $u_i$. The head part is determined in such a way that dk-encoding of the control block, in its two forms with either one or the other kind of control bits inserted, is independent from the body part $u_{body,i}$ of the current data block $u_i$, and can therefore be done on its own. How long the control block must be made in order to be autonomously dk-encodable, depends of course also on the number of control bits $L_c$, which in turn depends on the underlying RLL code. More detail is provided in the description of example applications, below. A small number of control bits are preferable to keep the redundancy at a minimum and the DC-control blocks short.

Figure 2:
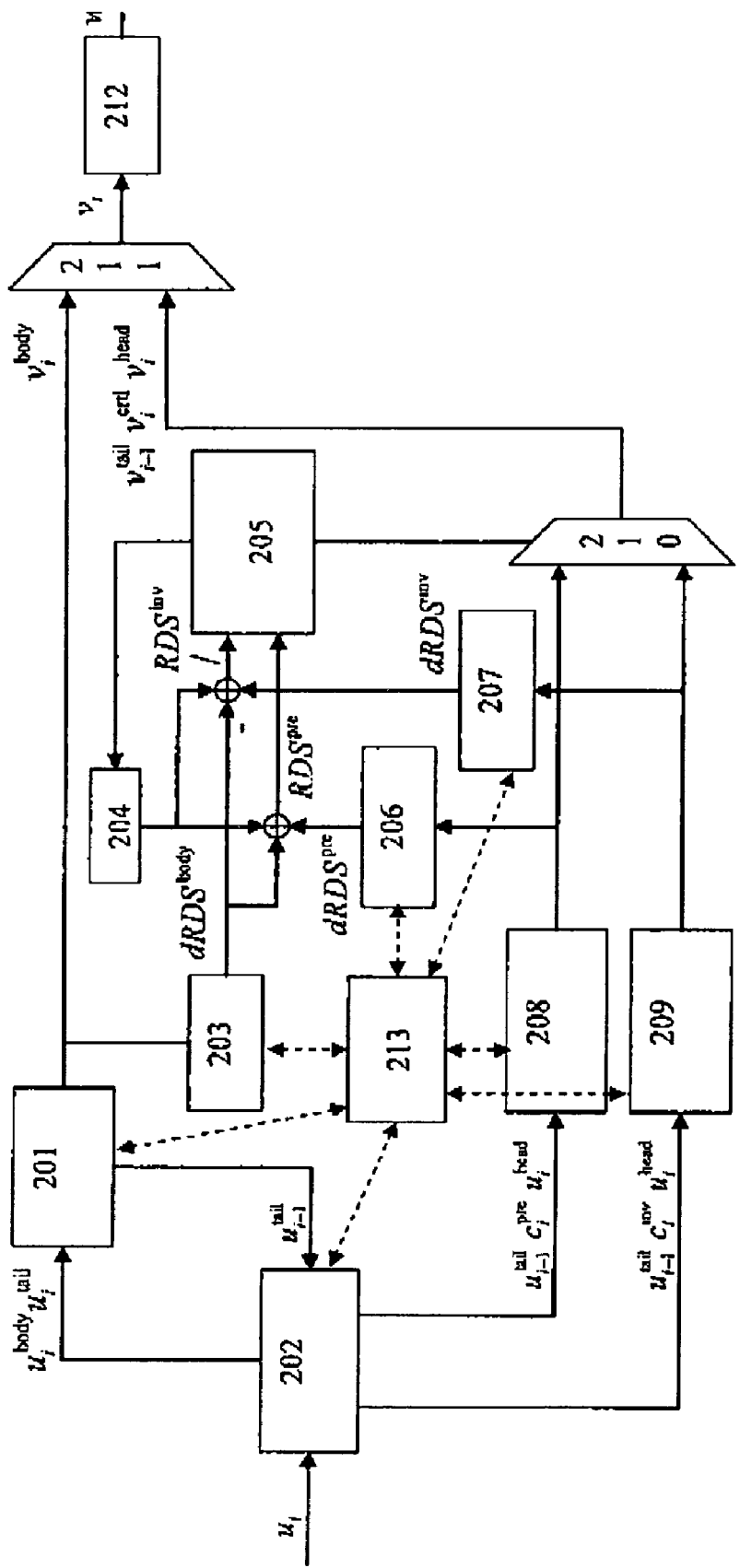
FIG. 2 shows a block diagram of an RLL encoder according to the invention.

FIG. 2 shows a block diagram of an RLL encoder according to the invention. With a given RLL code and a chosen constant number of control bits $L_c$, a sequence of data blocks $u_i$ is input to a Control Block Builder 202. The Control Block Builder 202, having internally memorized the length of the tail part $u_{tail,i-1}$ of the last processed data block $u_{i-1}$, assigns a certain number of bits from $u_i$ to its head part $u_{head,i}$. Using an inverting control bit pattern $c_{inv,i}$, the Control Block Builder 202 also assembles a polarity inverting control block 213 as $(u_{tail,i-1}, c_{inv,i}, u_{head,i})$. A counterpart, polarity preserving control block 214 is correspondingly composed as $(u_{tail,i-1}, c_{pre,i}, u_{head,i})$, using a preserving control bit pattern $c_{pre,i}$. Note that the values of the preserving control bit pattern $c_{pre,i}$ and the inverting control bit pattern $c_{inv,i}$ are not constant, they depend on the context represented by the tail part $u_{tail,i-1}$ and the head part $u_{head,i}$ surrounding them. The two control blocks 213, 214 thus composed are being dk-encoded in the subsequent First Control Block dk-encoder 208 and Second Control Block dk-encoder 209, respectively. A first and second dRDS Calculator 206, 207 calculate the Running Digital Sum differences $dRDS_{inv}$, $dRDS_{pre}$ of the dk-encoded polarity inverting and polarity preserving control blocks 213, 214, respectively.

Since the control block typically spans only a few bits, the associated dk codewords and the corresponding dRDS values are advantageously stored in a lookup table, so that the functions of the first/second control block dk-encoder 208, 209 and the first/second dRDS calculator are actually achieved by two parallel memory readout operations.

Because the head part $u_{head,i}$ of the current data block $u_i$ is part of the control block, the Control Block Builder 202 strips it therefrom, forwarding only the body part $u_{body,i}$ and the tail part $u_{tail,i}$ to the subsequent Data Block dk-encoder 201. The Data Block dk-encoder 201 generates a dk-encoded body part $v_{body,i}$, and feeds the tail part $u_{tail,i}$ which can not be encoded without look ahead, back to the Control Block Builder 202 to be processed together with the subsequent data block $u_{i+1}$. From the dk-encoded body part $v_{body,i}$, a third dRDS Calculator 203 calculates the body Running Digital Sum difference $dRDS_{body}$. Knowing $dRDS_{body}$, and taking into account that, due to the different polarity of the control bits $c_{inv}, c_{pre}$ inserted in front of the body, the body Running Digital Sum difference $dRDS_{body}$ will contribute to the overall RDS in a positive or negative way, an RDS of the parity preserving case and of the parity inverting case are then calculated as $RDS_{pre}=RDS+dRDS_{body}+dRDS_{pre}$ $RDS_{inv}=RDS-dRDS_{body}+dRDS_{inv}$ A subsequent Control Block Selector 205 controls a multiplexer 210 to select, among the outputs of the first and second Control Block dk-encoder 208, 209, that dk-encoded output bitstream which corresponds to the control block which minimizes the absolute value of the RDS. The selected output bitstream, consisting of a dk-encoded tail part $v_{tail,i-1}$ of the previous data block $u_{i-1}$ of the dk-encoded control bits $v_{ctrl,i}$ and of the dk-encoded head part $v_{head,i}$ of the current data block $u_i$ is then concatenated in a time multiplexer 211 into the dk-encoded bitstream $v_i$. Corresponding to these operations, the Control Block Selector 205 forwards either the RDS of the parity preserving case $RDS_{pre}$ or the RDS of the parity inverting case $RDS_{inv}$ to an RDS register 204 for use in the next data block iteration, according to:

if abs( $RDS_{pre}$ ) < abs( $RDS_{inv}$ )
    RDS = $RDS_{pre}$;
else
    RDS = $RDS_{inv}$;
end.

In a last step, the dk-encoded bitstream $v_i$ is precoded in a precoder 212 into a precoded stream $w_i$.

The Running Digital Sum calculations as described above amount to evaluating the Running Digital Sums at fixed positions at or near the boundaries of the data blocks, whereas the individual shape and slope of the RDS in between these evaluation positions is not being considered. Especially in the case of long data blocks, the random walk-like nature of the RDS as a function of the bit sequence index will be prominent, and selecting the control block by just looking at the RDS at the evaluation position may not be the optimal thing to do. It may be preferable to monitor the maxima and minima of RDS(i) and derive from these a selection criterion, instead.

FIG. 4 shows a block diagram of an RLL-decoder to be used in connection with the RLL encoder according to the invention. A stream of readout bits, formatted into readout tuples x' is predecoded in a predecoder 403 into a stream of dk decodable tuples v', which in turn are dk-decoded in a dk-decoder 402 and are passed through a control bit extractor 401. The control bit extractor 401 simply extracts and removes the $L_c$ control bits after every $L_{db}$ data bits. At the output of the control bit extractor 401, a stream of RLL decoded tuples u' is obtained.

To illustrate the explanations above, the invention will now be applied to two industry standard RLL codes of look ahead and variable length type. For each of the two examples, it is shown how many head bits must be assigned and how the control bits must be set to make the control block either polarity preserving or polarity inverting. It is shown that the code of the first example needs at least 2 control bits to fulfil the method's requirements, and the code of the second example needs at least 3 control bits. The ideal case would be an RLL code requiring only a single control bit.

FIG. 5 illustrates the first example, namely to use the invented method on the (1,7) RLL look ahead code according to U.S. Pat. No. 4,337,458. This RLL code uses a basic encoding table 501 and a substitution encoding table 502 that prevents two "ones" from appearing consecutively within the code, thereby implementing the d=1 constraint. Substitution is applied when a data word 00 or 10 occurs and 00 or 01 follows.

Using this dk-encoding rule, there are several cases, where the end of a data block can be completely dk-encoded without any reference to subsequent bits; in all these cases a tail length of zero, corresponding to a notion of "no tail", are to be decided for the data block:

when the data block ends in a data word "00" which happens to be substitution coded together with its preceding data word of "00" or "10"; such substitution coding can be performed without any reference to subsequent bits;
when the data block ends in a data word of "01" or "11".

After progressing to the next data block, these cases correspond to a notion of "previous block has no tail", they are covered in lines 1-6 of the control bit insertion Table 503 shown in FIG. 5. Among these, lines 1-2 cover the cases where the current data block starts with a "1", i.e. with a data word of "10" or "11". In these cases, the preserving control bit pattern $c_{pre,i}$ and the inverting control bit pattern $c_{inv,i}$ are applied as depicted in the table lines, and the data word at the start of the current data block can be dk-encoded together with the subsequent bits. This corresponds to a notion of this data block having "no header", or header length zero. In this case, the RDS contribution $dRDS_{ctrl}$ of both forms of control block happens to be equal, namely −1, so that the only effect of selecting either the preserving or the inverting control block is to invert, if so desired, the RDS contribution of the body of the data block. With other words, if no bits are assigned to $u_{tail,i-1}$, head bits of $u_i$ have to be taken into account if $u_i$ starts with a "0", because then it may be necessary to use the substitution table for dk-encoding of control bits and head bits, as shown in lines 3-6 of the control bit insertion table 503. No special care has to be taken if $u_i$ starts with "1", as covered in lines 1-2 of the control bit insertion table 503; no bits will be assigned to $u_{head,i}$ then. Note that in the column marked "Data" of the control bit insertion table 503, a "dot" is used to indicate that substitution coding according to the substitution coding table 502 is applied, whereas a "space" is used to indicate that basic coding according to the basic coding table 501 is applied independently for the left and right triplet.

Lines 7-10 of the control bit insertion table 503 in FIG. 5 cover the cases where the last data word of the preceding data block must actually be considered a tail, because it cannot be dk-encoded without reference to subsequent bits outside that previous data block. This is the case when the previous data block ends in a "00" that is not being substitution coded together with its predecessor, or
when
the previous data block ends in a "10".

The Control bit insertion Table 503 of FIG. 5 reveals in lines 7-10 how the control bits have to be set for these cases of having a tail; to either preserve the polarity (i.e. to have an even number of "ones" within the coded control block) or to invert the polarity (i.e. to have an odd number of "ones" within the coded control block). With the given code, it so happens that no head bits need to be assigned to $u_i$ for these cases.

FIG. 6 illustrates the second example, namely to use the invented method on a known (2,7) RLL variable length code using a single variable length basic coding table 601. The Control bit insertion table 602 of this RLL code is found through application of similar considerations as described above. Note that for this code, basic dk-encoding is done by independently translating groups of two, three, or four data bits to four, six, or eight code bits, respectively; the group length depending on the bit values. Note also, that with this given dk-encoding rule, it so happens that for the control blocks, cases exist where the control block must encompass both, a tail from the previous data block as well as a head from the current data block, as shown in lines 7-10 of the control bit insertion table 602 of FIG. 6. As the control bit insertion table 602 shows, three control bits must be used here, resulting in a higher redundancy than in the example of FIG. 5.

With other words, for controlling the DC-content of a Run Length Limited RLL modulated channel bit stream organized in data blocks ($u_i$), control bits ($c_{inv}$, $c_{pre}$) are periodically inserted into control blocks (108) which are dynamically placed and sized near the data block boundaries in such a way as to enable independent dk-encoding of the data blocks body ($u_{body,i}$) and the control blocks (108). Running digital sum differences ($dRDS_{inv}$, $dRDS_{pre}$, $dRDS_{body}$) are calculated. Control bit insertion is done in such a way that the d,k constraints of the RLL code are not violated, that the encoded dk sequence of the data block body ($u_{body,i}$) is not altered, and that the running digital sum (RDS) is minimized by eventually inverting the contribution of the data block body thereto. Compared to the number of data bits per data block, few control bits are sufficient to keep the digital sum variation DSV of the Running Digital Sum RDS small.

What is claimed is:

1. A method of channel encoding binary data consisting of a sequence of data blocks, comprising steps of
    separating from the data blocks head parts having individual head part lengths which enable that dk-encoding the head parts does not depend on a subsequent remainder of the respective data block;
    separating the remainder of each of the data blocks into a body part and a tail part having individual lengths which enable that dk-encoding the body parts does not depend on the subsequent tail parts;
    combining the tail part of a previous data block with an inverting control bit pattern and the head part of a current data block into a polarity inverting control block;
    combining the tail part of the previous data block with a preserving control bit pattern and the head part of the current data block into a polarity preserving control block;
    dk-encoding the polarity inverting control block and the polarity preserving control block;
    evaluating one Running Digital Sum difference each, for the dk-encoded polarity inverting control block and for the dk-encoded polarity preserving control block; and deriving therefrom Running Digital Sums for the polarity inverting case and for the polarity preserving case;
    selecting, as a selected control block, one of the dk-encoded polarity inverting control block and the dk-encoded polarity preserving control block, depending on which of the Running Digital Sums has smaller magnitude;
    time-multiplexing the selected control block together with a dk-encoded body part, and NRZI modulating the result into the channel encoded binary data.

2. The method of claim 1, wherein the step of separating encompasses:
    locating the start of the body part of a data block as the first position within the data block where the bit grouping used in assigning code bits to data bits is independent of the grouping used for the assigning within the control block preceding the body part;
    locating the start of the tail part of a data block as being the first position within the data block where deriving the code bits for the data bits needs information about at least one bit located after the data block.

3. The method of claim 1, wherein the step of deriving a Running Digital Sum encompasses that to a previous value of the Running Digital Sum, the following is added:
    for the polarity preserving case: the Running Digital Sum difference of the dk-encoded polarity preserving control block, and a Running Digital Sum difference of the dk-encoded body part;
    for the polarity inverting case: the Running Digital Sum difference of the dk-encoded polarity inverting control block, and the negative Running Digital Sum difference of the dk-encoded body part.

4. The method of claim 1, wherein the steps of dk-encoding and evaluating are performed with a table lookup operation.

5. The method of claim 4, wherein the step of table lookup encompasses:
    using the tail part of the previous data block and the beginning of the current data block as a table entry index;
    retrieving, from the table cell thus accessed, at least one of the value to be used as the inverting control bit pattern, the value to be used as the preserving control bit pattern, code bits constituting the dk-encoded control block, and the RDS contribution of the dk-encoded control block.

6. The method of claim 1, wherein a shortest possible head part length and a shortest possible tail part length are used.

7. An apparatus for channel encoding binary data consisting of a sequence of data blocks, comprising
    a Control Block Builder equipped and configured to separate from the data blocks head parts having individual lengths which enable that dk-encoding any head part does not depend on a subsequent remainder of the respective data block; to separate the remainder of each of the data blocks into a body part and a tail part having individual lengths which enable that dk-encoding the body parts does not depend on the subsequent tail parts; to combine the tail part of a previous data block with an inverting control bit pattern and the head part of the current data block into a polarity inverting control block, and to combine the tail part of the previous data block with a preserving control bit pattern and the head part of the current data block into a polarity preserving control block;
    a dk-encoder equipped and configured to dk-encode the polarity inverting control block, the polarity preserving control block and the body part;
    a Running Digital Sum calculator equipped and configured to calculate Running Digital Sum differences of the dk-encoded polarity inverting control block, the dk-encoded polarity preserving control block and the dk-encoded body part; and to derive therefrom Running Digital Sums for the polarity inverting case and for the polarity preserving case;
    a selector to select one of the dk-encoded polarity inverting control block and the dk-encoded polarity preserving control block, depending on which of the Running Digital Sums has smaller magnitude, and to time-multiplex the selected control block together with the dk-encoded body part; and
    a modulator to NRZI modulate the time-multiplexed data into the channel encoded binary data.

8. The apparatus of claim 7, additionally comprising a table lookup unit equipped and configured to be accessed from at least one of the Control Block Builder, the dk-encoder, and the Running Digital Sum calculator, the table containing at feast one kind of entries of values to be used as the respective inverting control bit pattern, values to be used as the respective preserving control bit pattern, code bits constituting the respective dk-encoded control block, and RDS contributions of the respective dk-encoded control block.

9. The apparatus of claim 7, where a shortest possible head part length and a shortest possible tail part length are used.

* * * * *